United States Patent
Sakai et al.

(10) Patent No.: US 10,338,092 B2
(45) Date of Patent: Jul. 2, 2019

(54) PHYSICAL QUANTITY SENSOR AND METHOD FOR MANUFACTURING THE SAME

(71) Applicant: DENSO CORPORATION, Kariya, Aichi-pref. (JP)

(72) Inventors: Minekazu Sakai, Kariya (JP); Kiyomasa Sugimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 576 days.

(21) Appl. No.: 15/022,954

(22) PCT Filed: Sep. 23, 2014

(86) PCT No.: PCT/JP2014/004859
§ 371 (c)(1),
(2) Date: Mar. 18, 2016

(87) PCT Pub. No.: WO2015/045360
PCT Pub. Date: Apr. 2, 2015

(65) Prior Publication Data
US 2016/0223582 A1 Aug. 4, 2016

(30) Foreign Application Priority Data

Sep. 26, 2013 (JP) .................................. 2013-200068

(51) Int. Cl.
*G01P 15/08* (2006.01)
*G01P 15/125* (2006.01)
(Continued)

(52) U.S. Cl.
CPC .......... *G01P 15/125* (2013.01); *B81B 7/0064* (2013.01); *G01P 15/0802* (2013.01);
(Continued)

(58) Field of Classification Search
CPC .... G01P 15/125; G01P 15/18; G01P 15/0802; G01P 1/023; G01P 1/02; G01C 19/5747;
(Continued)

(56) References Cited

U.S. PATENT DOCUMENTS 5,417,312 A * 5/1995 Tsuchitani ............... G01P 1/003
188/181 A
5,627,317 A * 5/1997 Offenberg ........... G01P 15/0802
73/514.32
(Continued)

FOREIGN PATENT DOCUMENTS

JP 2010-139495 A 6/2010
JP 2010-145212 A 7/2010
(Continued)

OTHER PUBLICATIONS

International Search Report and Written Opinion of the International Searching Authority dated Nov. 18, 2014 issued in the corresponding International application No. PCT/JP2014/004859 (and English translation).

*Primary Examiner* — Helen C Kwok
(74) *Attorney, Agent, or Firm* — Posz Law Group, PLC

(57) ABSTRACT

In a physical quantity sensor, a contact part that is directly and electrically connected to an external circuit is formed in a support substrate, and the support substrate is maintained at a predetermined potential through the contact part. With this configuration, the support substrate is maintained at the predetermined potential without disposing an electrode in the interior of the semiconductor layer. For that reason, a processing precision can be restrained from being reduced in forming the movable electrode, and hence a detection precision can be restrained from being reduced.

12 Claims, 13 Drawing Sheets

(51) Int. Cl.
 *G01P 15/18* (2013.01)
 *B81B 7/00* (2006.01)
 *H01L 29/84* (2006.01)
 *H01L 29/66* (2006.01)

(52) U.S. Cl.
 CPC ........ *G01P 15/18* (2013.01); *H01L 29/66007*
 (2013.01); *H01L 29/84* (2013.01); *B81B*
 *2201/0235* (2013.01); *G01P 2015/0814*
 (2013.01)

(58) Field of Classification Search
 CPC .............. G01C 19/5719; G01C 19/574; G01C
 19/5712
 See application file for complete search history.

(56) References Cited

U.S. PATENT DOCUMENTS

| | | | | |
|---|---|---|---|---|
| 6,240,782 | B1 * | 6/2001 | Kato | ................... G01P 15/0802 361/280 |
| 6,450,031 | B1 * | 9/2002 | Sakai | ............... B81B 3/0086 73/514.16 |
| 7,578,186 | B2 * | 8/2009 | Matsuhisa | .............. G01C 19/56 73/504.12 |
| 2007/0266787 | A1 * | 11/2007 | LaFond | ............... G01P 15/0802 73/514.01 |
| 2008/0030205 | A1 * | 2/2008 | Fujii | ........................ B81B 7/02 324/661 |
| 2009/0134459 | A1 | 5/2009 | Goto et al. | |
| 2009/0199637 | A1 * | 8/2009 | Sugiura | ............... G01P 15/0802 73/514.32 |
| 2009/0261430 | A1 * | 10/2009 | Suzuki | .................... B81B 7/007 257/417 |
| 2010/0127715 | A1 * | 5/2010 | Jeong | ................. G01C 19/5719 324/661 |
| 2010/0148341 | A1 * | 6/2010 | Fuji | ........................ B81B 7/007 257/686 |
| 2010/0155865 | A1 * | 6/2010 | Sugiura | ............... B81C 1/00301 257/417 |
| 2010/0212426 | A1 * | 8/2010 | Oshio | ................... B81B 3/0051 73/514.32 |
| 2011/0048129 | A1 | 3/2011 | Yamanaka et al. | |
| 2011/0227174 | A1 * | 9/2011 | Fujii | .................... B81B 7/0006 257/415 |
| 2012/0223410 | A1 | 9/2012 | Fujii et al. | |
| 2013/0133422 | A1 | 5/2013 | Yamanaka et al. | |
| 2013/0269434 | A1 * | 10/2013 | Kamisuki | ............ G01P 15/125 73/514.32 |
| 2013/0312517 | A1 * | 11/2013 | Jeong | ................... G01P 15/125 73/504.04 |
| 2016/0131680 | A1 * | 5/2016 | Sugimoto | .......... B81C 1/00166 73/514.32 |

FOREIGN PATENT DOCUMENTS

| | | |
|---|---|---|
| JP | 2010-223640 A | 10/2010 |
| JP | 2010-238921 A | 10/2010 |
| JP | 2012-183612 A | 9/2012 |

* cited by examiner

PHYSICAL QUANTITY SENSOR AND METHOD FOR MANUFACTURING THE SAME

CROSS REFERENCE TO RELATED APPLICATION

This application is a U.S. national stage of International Application No. PCT/JP2014/004859 filed on Sep. 23, 2014 and is based on Japanese Patent Application No. 2013-200068 filed on Sep. 26, 2013, the disclosures of which are incorporated herein by reference.

TECHNICAL FIELD

The present disclosure relates to a physical quantity sensor and a method for manufacturing the physical quantity sensor in which a movable electrode is formed on a semiconductor layer of a semiconductor substrate where a buried insulating film and the semiconductor layer are laminated on a support substrate in order, a cap that seals the movable electrode is joined to the semiconductor layer, and the support substrate and the cap are maintained at a predetermined potential.

BACKGROUND ART

Up to now, as the physical quantity sensor of this type, an acceleration sensor for detecting acceleration has been proposed (for example, refer to Patent Literature 1).

The acceleration sensor is configured with the use of silicon on insulator (SOI) substrate on which the buried insulating film and the semiconductor layer are laminated on the support substrate in order. In the semiconductor layer, a comb-shaped movable electrode and a comb-shaped fixed electrode that faces the movable electrode are formed, and a portion of the semiconductor layer partitioned from the movable electrode and the fixed electrode forms a peripheral part. A through-hole that penetrates through the peripheral part and the buried insulating film and reaches the support substrate is formed in the SOI substrate in a thickness direction (a stacking direction of the support substrate, the buried insulating film, and the semiconductor layer) of the SOI substrate, and a through-electrode that is electrically connected to the support substrate is buried in the through-hole.

The cap is formed of a semiconductor substrate or the like, and is formed with a contact part so as to receive a predetermined potential from an external circuit. The cap (semiconductor substrate) is joined to the semiconductor layer through a conductive film or the like so as to be electrically connected to the through-electrode formed on the SOI substrate. In other words, the cap (semiconductor substrate) is joined to the semiconductor layer through the conductive film or the like so as to be electrically connected to the support substrate through the through-electrode formed on the SOI substrate.

In the acceleration sensor of this type, the cap is maintained at the predetermined potential through the contact part, and the support substrate is maintained at the predetermined potential (the same potential as that of the cap) through the through-electrode. For that reason, the potentials of the cap and the support substrate can be restrained from being varied due to disturbance noise and the like, and an output variation can be restrained from occurring.

The acceleration sensor is manufactured as follows. Firstly, the SOI substrate in which the support substrate, the buried insulating film, and the semiconductor layer are laminated on each other in order is prepared. Next, the through-hole that penetrates through the peripheral part and the buried insulating film, and reaches the support substrate is formed in the SOI substrate, and then a metal film is buried in the through-hole to form the through-electrode. Then, reactive ion etching is performed to form the movable electrode and the fixed electrode in the semiconductor layer. The contact part is formed on the cap (semiconductor substrate). Thereafter, the semiconductor layer and the cap are joined to each other so that the support substrate and the cap (semiconductor substrate) are electrically connected to each other through the through-electrode formed on the SOI substrate, as a result of which the acceleration sensor is manufactured.

PRIOR ART LITERATURE

Patent Literature

PATENT LITERATURE: JP2012-186300A

SUMMARY OF INVENTION

In the manufacturing method described above, after the through-electrode has been formed on the SOI substrate, the movable electrode and the fixed electrode are formed. In that case, in forming the movable electrode and the fixed electrode, a thermal stress is applied to the semiconductor layer due to a difference in thermal expansion coefficient between the semiconductor layer and the through-electrode. For that reason, a processing precision of the movable electrode and the fixed electrode may be reduced, and hence a detection precision is likely to be reduced.

In this example, the acceleration sensor as the physical quantity sensor is exemplified. The same problem also arises in an angular velocity sensor in which the through-electrode is formed on the SOI substrate, and a predetermined potential is applied to the support substrate.

In view of the above, it is an object of the present disclosure to provide a physical quantity sensor which is capable of suppressing a reduction in detection precision, and a method for manufacturing the same.

According to a first aspect of the present disclosure, a physical quantity sensor includes: a semiconductor substrate that includes a support substrate, a buried insulating film disposed on the support substrate, and a semiconductor layer disposed on an opposite side to the support substrate across the buried insulating film; a movable electrode that is disposed in the semiconductor layer, and displaced according to a physical quantity; a peripheral part that surrounds the movable electrode and is partitioned from the movable electrode in the semiconductor layer a fixed electrode that is disposed to face the movable electrode; and a cap that is joined to the semiconductor layer, and seals the movable electrode, in which the support substrate and the cap are maintained at a predetermined potential.

In the physical quantity sensor, the support substrate is formed with a contact part that is directly and electrically connected to an external circuit, and is maintained at the predetermined potential through the contact part.

According to the above configuration, the contact part directly and electrically connected to the external circuit is formed in the support substrate, and the support substrate is maintained at the predetermined potential through the contact part. In other words, the support substrate is maintained at the predetermined potential without disposing the electrode in the interior of the semiconductor layer. For that reason, the processing precision can be restrained from being reduced in forming the movable electrode, and hence the detection precision can be restrained from being reduced.

According to a second aspect of the present disclosure, a method for manufacturing a physical quantity sensor includes: preparing a semiconductor substrate; partitioning a movable electrode and a peripheral part in a semiconductor layer; joining the semiconductor layer and a cap so that the peripheral part of the semiconductor layer is electrically connected to the cap; forming first hole parts in a support substrate from a side of the support substrate opposite to a buried insulating film to reach the buried insulating film, at a portion opposing to a portion electrically connected to the movable electrode, a portion opposing to a portion electrically connected to a fixed electrode, and a portion opposing to a peripheral part in the support substrate; forming an insulating film on a portion of the support substrate opposite to the buried insulating film while forming an insulating film on the first hole parts; forming a contact hole for exposing the support substrate in an insulating film formed on a portion of the support substrate opposite to the buried insulating film while forming second hole parts in the buried insulating film located at bottom parts of the first hole parts to provide a movable electrode hole part, a fixed electrode hole part, and a peripheral part hole part by the first hole parts and second hole parts; and forming a contact part in the contact hole while forming through-electrodes in the movable electrode hole part, the fixed electrode hole part, and the peripheral part hole part through the insulating films.

According to the above configuration, the movable electrode hole part, the fixed electrode hole part, the peripheral part hole part, and the contact hole are formed in the same process. In addition, the through-electrodes formed in the movable electrode hole part, the fixed electrode hole part, and the peripheral part hole part, and the contact part formed in the contact hole are formed in the same process. For that reason, an increase in the number of manufacturing processes can be restrained.

According to a third aspect of the present disclosure, a method for manufacturing a physical quantity sensor includes: forming a buried insulating film on a support substrate, and a first recessed portion configuring a part of a recessed part from a side adjacent to the buried insulating film; forming pad parts on a semiconductor layer at formation areas where a portion electrically connected to a movable electrode, a portion electrically connected to a fixed electrode, and a peripheral part are to be formed in a semiconductor layer; joining the buried insulating film and the semiconductor layer so that the pad parts are received in the first recessed portion; partitioning the movable electrode and the peripheral part in the semiconductor layer; joining the semiconductor layer and the cap so that the peripheral part of the semiconductor layer is electrically connected to the cap; forming a through-hole for exposing the pad part formed in the peripheral part from an opposite side to the buried insulating film, in the support substrate; forming a contact part in the through-hole to be connected to the pad part formed on the peripheral part; and forming a second recessed portion to communicate with the first recessed portion so that the recessed part is provided by the first and second recessed portions.

BRIEF DESCRIPTION OF DRAWINGS

The above and other objects, features and advantages of this disclosure will become more apparent from the following detailed description made with reference to the accompanying drawings, in which.

DESCRIPTION OF EMBODIMENTS

Figure 1:
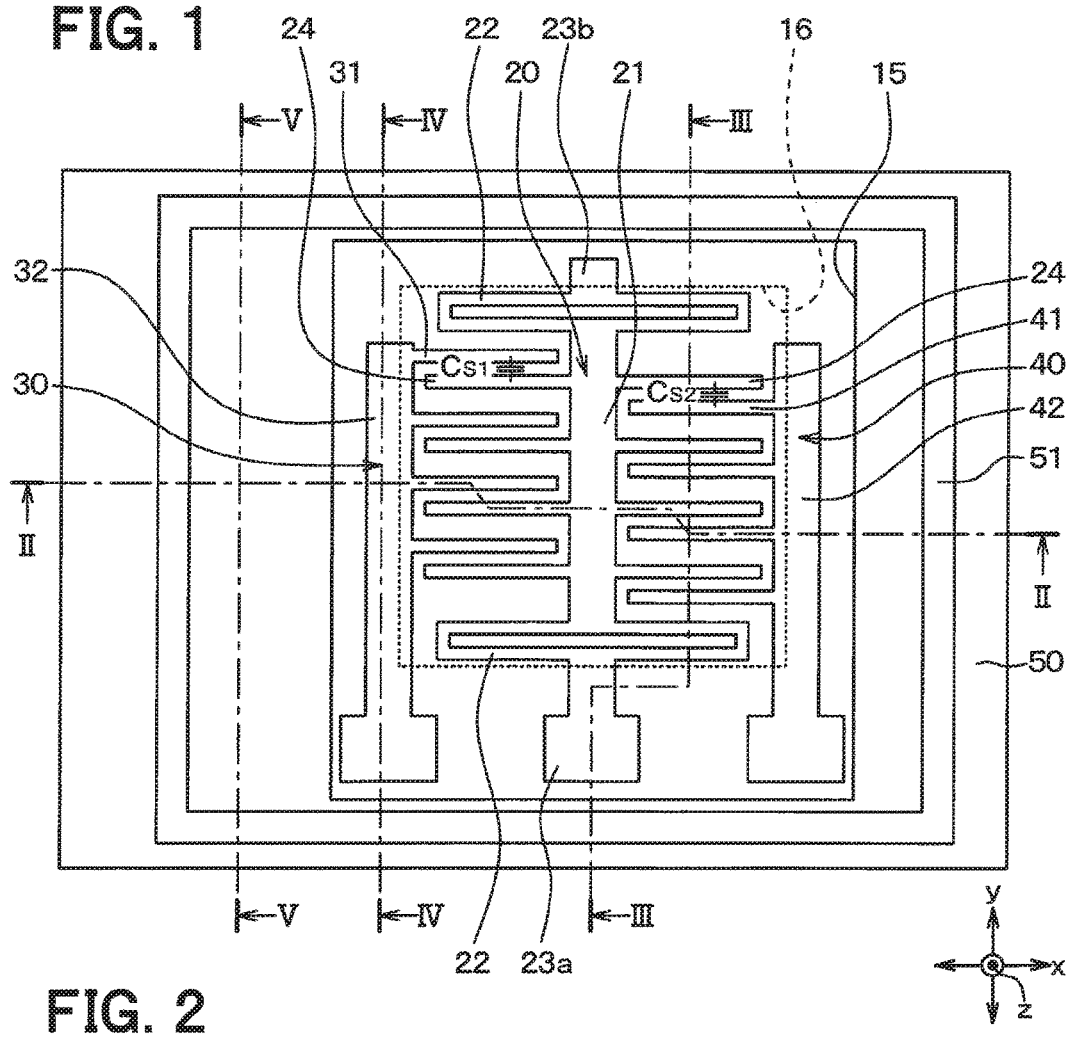
FIG. 1 is a top view of an acceleration sensor according to a first embodiment of the present disclosure.
Figure 2:
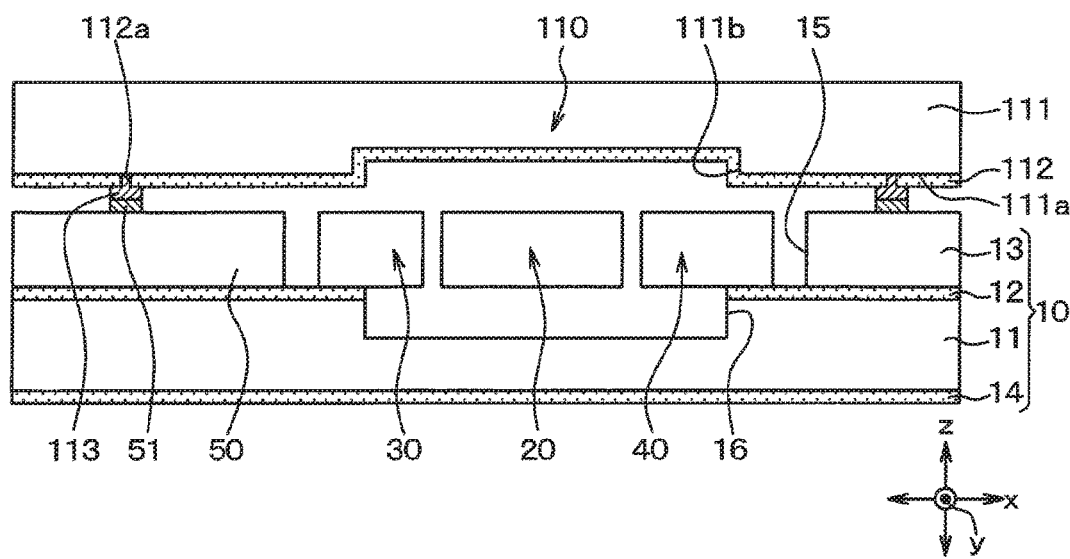
FIG. 2 is a cross-sectional view taken along a line II-II in FIG. 1.

Hereinafter, embodiments according to the present disclosure will be described with reference to the drawings. In each of the following embodiments, the description will be provided using the same reference numerals for the same or equivalent portions.

(First Embodiment)

First Embodiment of the present disclosure will be described with reference to the drawings. In the present embodiment, a description will be given of an example in which a physical quantity sensor according to the present disclosure is applied to an acceleration sensor for performing an operation control of air bags, an ABS (antilock brake system), and an ESC (electronic stability control), etc.

As illustrated in FIGS. 1 to 5, an acceleration sensor according to the present embodiment is configured to join a cap 110 to a semiconductor substrate 10. FIG. 1 is a top view of the semiconductor substrate 10 in the acceleration sensor. The semiconductor substrate 10 is provided by an SOI substrate in which a support substrate 11, a buried insulating film 12, and a semiconductor layer 13 are laminated on each other in order, and an insulating film 14 is formed on a surface of the support substrate 11 opposite to the buried insulating film 12. The support substrate 11 and the semiconductor layer 13 are made of a silicon substrate, polysilicon or the like, the buried insulating film 12 is made of $SiO_2$, SiN or the like, and the insulating film 14 is made of TEOS, or the like.

In the semiconductor substrate 10, the semiconductor layer 13 is subjected to known micromachining to form a groove portion 15, and a beam structure of a comb-teeth shape having a movable portion 20, and first and second fixing portions 30 and 40 is partitioned by the groove portion 15. A recessed part 16 in which a portion corresponding to a predetermined area of the movable portion 20 and the first and second fixing portions 30 and 40 is removed is defined in the support substrate 11 and the buried insulating film 12.

Respective directions of an x-axis, a y-axis, and a z-axis in FIGS. 1 to 5 will be described. In FIGS. 1 to 5, a direction along the x-axis represents a horizontal direction on a paper surface of FIG. 1, and a direction along the y-axis represents a direction orthogonal to a direction along the x-axis on a plane of the semiconductor substrate 10. A direction along the z-axis represents a direction normal to a surface direction of the semiconductor substrate 10. Hereinafter, the direction along the x-axis is called "x-axis direction", the direction along the y-axis is called "y-axis direction", and the direction along the z-axis is called "z-axis direction".

The movable portion 20 is configured in such a manner that both ends of a rectangular rod-shaped weight portion 21 formed to intersect with the recessed part 16 in a longitudinal direction are coupled integrally with respective anchored portions 23a and 23b through respective beam portions 22. The anchored portions 23a and 23b are fixed to the buried insulating film 12, and supported to the support substrate 11, resulting in a state where the weight portion 21 and the beam portions 22 in the movable portion 20 face the recessed part 16.

In the present embodiment, the weight portion 21 is formed so that a longitudinal direction of the weight portion 21 is in parallel to the y-axis direction. In the present embodiment, the anchored portion 23a corresponds to a portion of the semiconductor layer 13 which is electrically connected with movable electrodes 24.

The beam portions 22 are each formed into a rectangular frame shape in which two parallel beams are coupled with each other at both ends of those beams, and have a spring function of being displaced in a direction orthogonal to a longitudinal direction of the two beams. Specifically, when receiving an acceleration including a component in the y-axis direction, the beam portions 22 displace the weight portion 21 in the y-axis direction, and restore the weight portion 21 to an original state according to a loss of the acceleration. Therefore, the weight portion 21 coupled to the support substrate 11 through the beam portions 22 can be displaced above the recessed part 16 in a displacement direction of the beam portions 22 according to the application of the acceleration.

The movable portion 20 includes multiple movable electrodes 24 which are integrally formed to be protruded from both side surfaces of the weight portion 21 in an opposite direction to each other, in a direction (x-axis direction) orthogonal to the longitudinal direction of the weight portion 21. Referring to FIG. 1, the movable electrodes 24 are protruded from a left side and a right side of the weight portion 21 four by four, and face the recessed part 16. Each of the movable electrodes 24 is integrally formed with the weight portion 21 and the beam portions 22, and can be displaced together with the weight portion 21 in the y-axis direction by displacing the beam portions 22.

The first and second fixing portions 30 and 40 are configured so that multiple first and second fixed electrodes 31 and 41 are supported by respective first and second wiring parts 32 and 42, and are formed across the weight portion 21. The first and second fixed electrodes 31 and 41 are disposed to face side surfaces of the movable electrodes 24 in a parallel state at detection intervals from the respective side surfaces. Specifically, the first and second fixed electrodes 31 and 41 are arranged in a pectinate shape four by four so as to be engaged with pectinate gaps in the movable electrodes 24, and supported to the first and second wiring parts 32 and 42 in a cantilevered manner so as to face the recessed part 16.

In the present embodiment, the first and second wiring parts 32 and 42 correspond to portions of the semiconductor layer 13 which are electrically connected with the first and second fixed electrodes 31 and 41.

In this way, in the present embodiment, a capacitance Cs1 is generated between the movable electrode 24 and the first fixed electrode 31, and a capacitance Cs2 is generated between the movable electrode 24 and the second fixed electrode 41. The acceleration is detected on the basis of a difference between the respective capacitances Cs1 and Cs2.

An outer peripheral part of the semiconductor layer 13 which is partitioned by the movable portion 20, the first and second fixing portions 30 and 40, and the groove portion 15 in the semiconductor substrate 10 configures a peripheral part 50, and is supported to the support substrate 11 through the buried insulating film 12.

The peripheral part 50 is formed with a frame-shaped sealing part 51 that surrounds the movable portion 20 and the first, second fixing portions 30, 40. The sealing part 51 is made of a metal material as a conductive member, and in the present embodiment, made of aluminum or the like.

Figure 3:
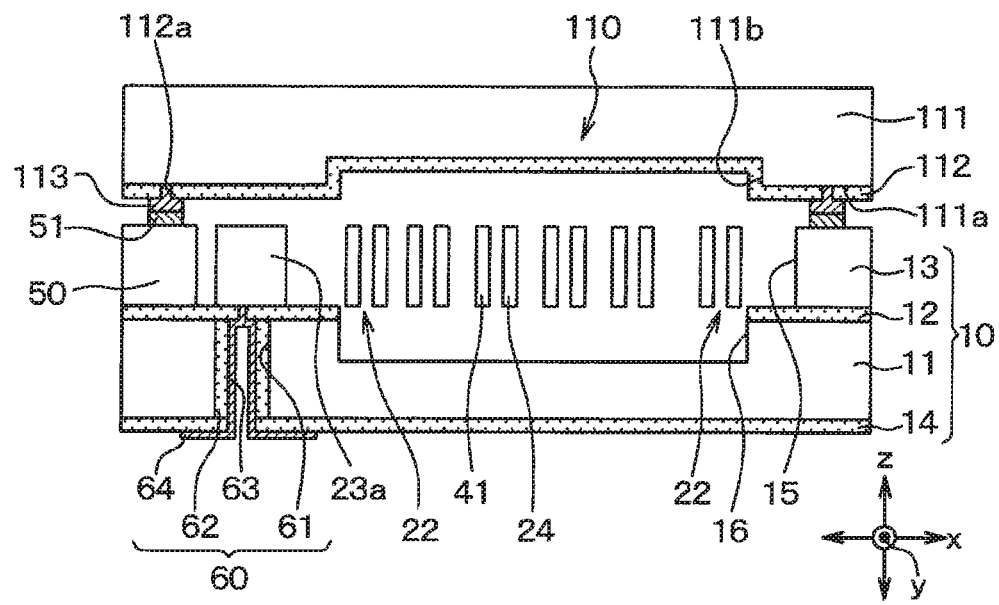
FIG. 3 is a cross-sectional view taken along a line III-III in FIG. 1.
Figure 4:
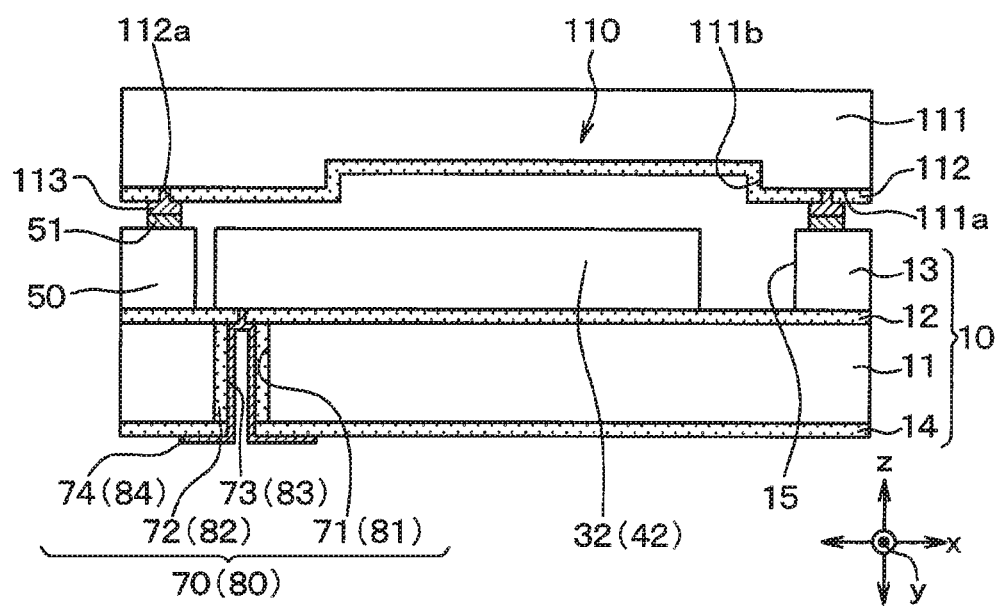
FIG. 4 is a cross-sectional view taken along a line IV-IV in FIG. 1.
Figure 5:
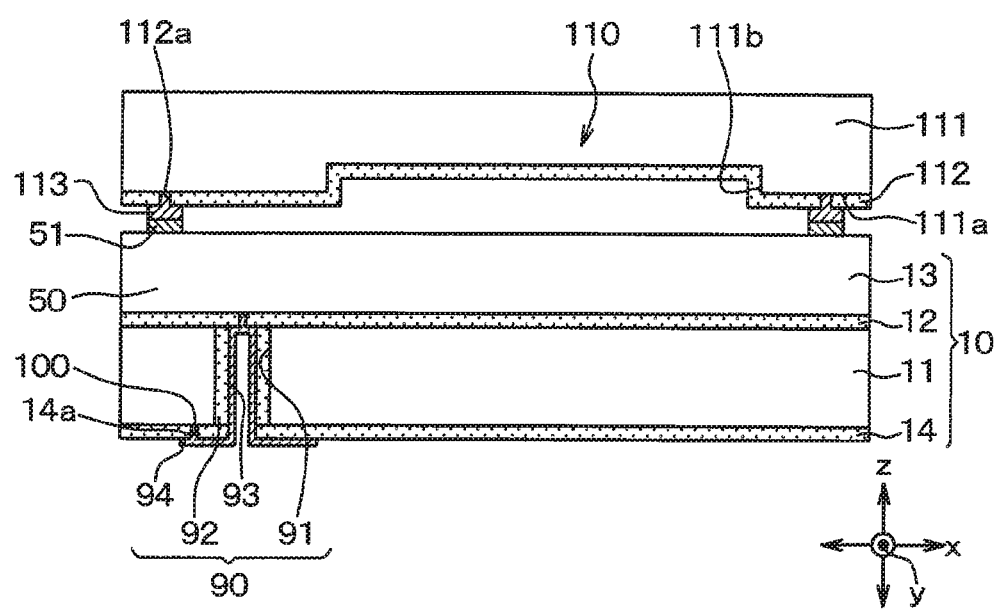
FIG. 5 is a cross-sectional view taken along a line V-V in FIG. 1.

As illustrated in FIGS. 3 to 5, a movable-electrode electrode portion 60, first and second fixed-electrode electrode portions 70, 80, and a peripheral-part electrode portion 90 are formed in the semiconductor substrate 10. FIG. 4 illustrates a cross-section taken along the first fixing portion 30, and a cross-section taken along the second fixing portion 40 is also identical with that in FIG. 4. Therefore, in FIG. 4, reference numerals of the first and second fixing portions 30 and 40 are indicated.

As illustrated in FIG. 3, the movable-electrode electrode portion 60 is configured in such a manner that a through-electrode 63 is formed over a movable electrode hole part 61 through an Insulating film 62, and a pad part 64 electrically connected to the through-electrode 63 is formed on the Insulating film 14. The movable electrode hole part 61 penetrates through the insulating film 14, the support substrate 11, and the buried insulating film 12, and reaches the anchored portion 23a.

Likewise, as illustrated in FIG. 4, the first and second fixed-electrode electrode portions 70 and 80 are configured in such a manner that through-electrodes 73 and 83 are formed over first and second fixed-electrode hole parts 71 and 81 through insulating films 72 and 82, respectively, and pad parts 74 and 84 electrically connected to the through-electrodes 73 and 83, respectively, are formed on the insulating film 14. The first and second fixed electrode holes 71 and 81 penetrates through the insulating film 14, the support substrate 11, and the buried insulating film 12, and reaches the first and second wiring parts 32 and 42, respectively.

As illustrated in FIG. 5, the peripheral-part electrode portion 90 is configured in such a manner that a through-electrode 93 is formed over a peripheral part hole part 91 through an Insulating film 92, and a pad part 94 electrically connected to the through-electrode 93 is formed on the Insulating film 14. The peripheral part hole part 91 penetrates through the insulating film 14, the support substrate 11, and the buried insulating film 12, and reaches the peripheral part 50.

In other words, in the present embodiment, the pad parts 64 to 94 formed on the insulating film 14 are connected to the external circuit, and a predetermined potential is applied to the movable electrodes 24, the first and second fixed electrodes 31 and 41, and the peripheral part 50.

As illustrated in FIG. 5, a contact hole 14a for exposing a predetermined location of the support substrate 11 is formed in the insulating film 14. A contact part 100 that is electrically connected with the support substrate 11 is formed in the contact hole 14a. In the present embodiment, the contact part 100 is integrated with the pad part 94 in the peripheral-part electrode portion 90, and the same potential as that of the peripheral part 50 is applied to the contact part 100.

The Insulating films 62 to 92 are made of a TEOS or the like, and the through-electrodes 63 to 93 and the contact part 100 are made of aluminum or the like.

As illustrated in FIGS. 2 to 5, the cap 110 is formed of a bonded substrate 111 and an insulating film 112.

A recessed part 111b is defined in the bonded substrate 111, and the recessed part 111b is provided in a portion that faces the movable electrodes 24 and the first, second fixed electrodes 31, 41 on one surface 111a of the bonded substrate 111 that faces the semiconductor substrate 10. The Insulating film 112 is formed on the one surface 111a and wall surfaces of the recessed part 111b of the bonded substrate 111.

The bonded substrate 111 is formed of, for example, a silicon substrate, and the insulating film 112 is made of, for example, $SiO_2$ or SiN.

A sealing part 113 shaped to correspond to the sealing part 51 is formed on the insulating film 112 in a portion facing the sealing part 51 which is formed on the peripheral part 50. In other words the sealing part 113 is formed into a frame shape corresponding to the sealing part 51. The sealing part 113 is electrically connected to the bonded substrate 111 through a contact hole 112a defined in the insulating film 112. The sealing part 113 is made of a metal material as a conductive member, and in the present embodiment, made of aluminum or the like.

The configuration of the cap 110 according to the present embodiment is described above. The semiconductor substrate 10 is joined to the cap 110 and integrated into one piece to configure an acceleration sensor. Specifically, the cap 110 is integrated with the semiconductor substrate 10 in such a manner that the sealing part 113 is metal-joined to the sealing part 51 formed on the semiconductor substrate 10 so as to seal the movable portion 20 and the first, second fixing portions 30, 40. The cap 110 (bonded substrate 111) is joined to the semiconductor substrate 10 through the sealing parts 51 and 113, to thereby be electrically connected to the peripheral part 50.

The acceleration sensor according to the present embodiment is configured as described above. The acceleration sensor is mounted on a member to be mounted in such a manner that a side of the cap 110 opposite to the insulating film 112 comes in contact with the member to be mounted, and the respective pad parts 64 to 94 are electrically connected to the external circuit through bonding wires or the like. With the above configuration, a predetermined potential is applied to the movable electrodes 24 and the first, second fixed electrodes 31, 41 through the pad parts 64 to 84. A predetermined potential is applied to the peripheral part 50, the support substrate 11, and the bonded substrate 111 through the pad part 94.

Next, a method of manufacturing the above acceleration sensor will be described with reference to FIGS. 6A to 9B. FIGS. 6A to 9B are cross-sectional views taken along a line III-III in FIG. 1.

Figure 6A:
FIGS. 6A to 6E are cross-sectional views illustrating a process of manufacturing the acceleration sensor illustrated in FIG. 1.

As illustrated in FIG. 6A, the support substrate 11 is prepared, and the buried insulating film 12 is formed on the support substrate 11 through a chemical vapor deposition (CVD) technique, thermal oxidation or the like.

Figure 6B:
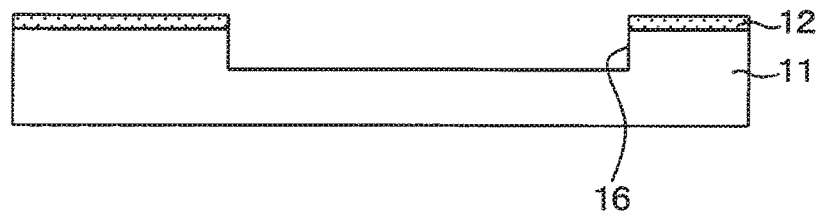

Then, as illustrated in FIG. 6B, a mask (not illustrated) such as a resist or an oxide film is formed on the buried insulating film 12, and wet etching or the like is performed to form the recessed part 16 in the support substrate 11 and the buried insulating film 12.

Figure 6C:
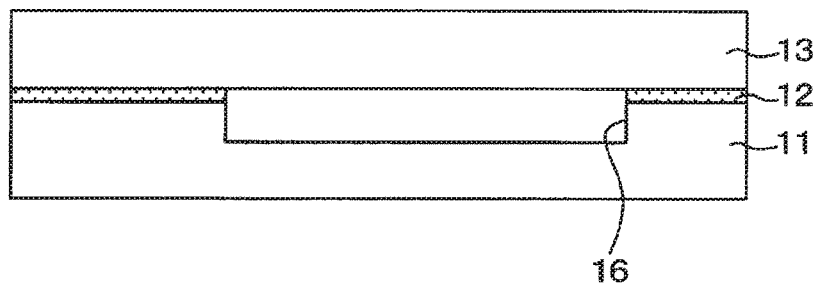

Subsequently, as illustrated in FIG. 6C, the buried insulating film 12 is joined directly to the semiconductor layer 13. In other words, first, a joint surface of the buried insulating film 12 and a joint surface of the semiconductor layer 13 are irradiated with $N_2$ plasma, $O_2$ plasma, or Ar ion beam, and the respective joint surfaces of the buried insulating film 12 and the semiconductor layer 13 are activated. Then, alignment is performed with an infrared microscope or the like using alignment marks which are suitably formed, and the buried insulating film 12 and the semiconductor layer 13 are joined directly to each other at a room temperature to 1100° C.

In this case, the direct joint is described as an example, but the buried insulating film 12 and the semiconductor layer 13 may be joined to each other by a joint technique such as an anodic bonding, an intermediate layer bonding, or a fusion function. Then, after the joint, a process for improving a joint quality such as high temperature annealing may be performed. In addition, after the joint, the support substrate 11 and the semiconductor layer 13 may be processed to have a desired thickness by polishing and grinding.

Figure 6D:
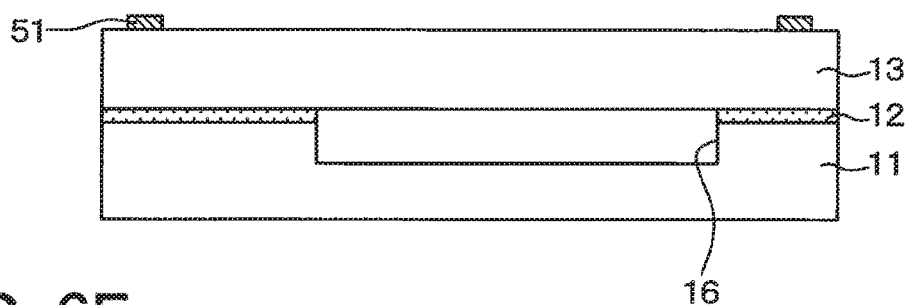

Then, as illustrated in FIG. 6D, a metal film is formed on the semiconductor layer 13 through a CVD technique or the like. A reactive ion etching or the like is performed with the use of a mask (not illustrated) such as a resist or an oxide film, and the metal film is patterned to form the sealing part 51.

Figure 6E:
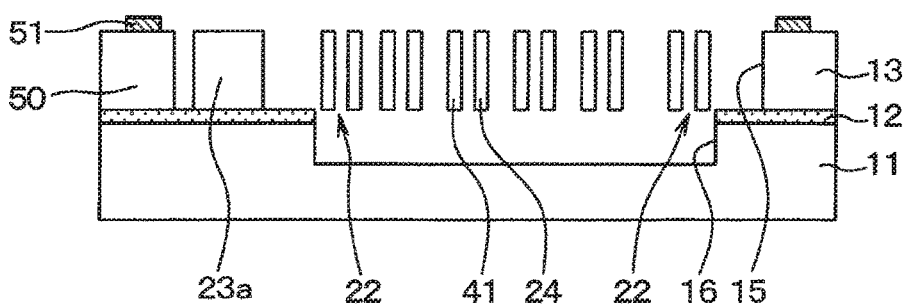

Then, as illustrated in FIG. 6E, a reactive ion etching or the like is performed with the use of a mask (not illustrated) such as a resist or an oxide film, and the groove portion 15 is defined in the semiconductor layer 13 to partition the movable portion 20, the first and second fixing portions 30 and 40, and the peripheral part 50.

In the above process, the sealing part 51 is formed on the semiconductor layer 13, and in forming the movable portion 20 and the first, second fixing portions 30, 40, a thermal stress is likely to be applied to the semiconductor layer 13 due to a difference in thermal expansion coefficient between the semiconductor layer 13 and the sealing part 51. However, the sealing part 51 is formed on the semiconductor layer 13, and as compared with a case in which the through-electrode is embedded in the interior of the semiconductor layer as in the conventional art, the thermal stress to be applied to the semiconductor layer 13 is small because expansion and contraction are enabled. For that reason, in this process, a processing precision of the movable portion 20 and the first and second fixing portions 30 and 40 is unlikely to be reduced.

Figure 7A:
FIGS. 7A to 7D are cross-sectional views illustrating a process of manufacturing the acceleration sensor illustrated in FIG. 1.
Figure 7B:
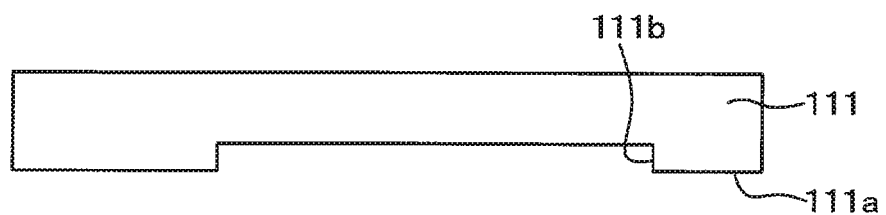

In another process different from that in FIGS. 6A to 6E, the bonded substrate 111 is prepared as illustrated in FIG. 7A, and the recessed part 111b is formed in the one surface 111a of the bonded substrate 111 as illustrated in FIG. 7B. Although being not particularly limited, the recessed part 111b can be defined by wet etching or the like using a mask (not illustrated) such as a resist or an oxide film.

Figure 7C:
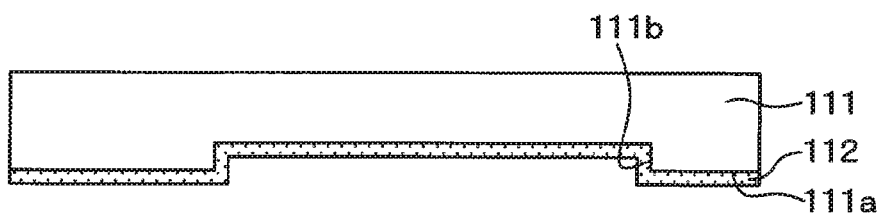

Then, as illustrated in FIG. 7C, the insulating film 112 is formed on the one surface 111a of the bonded substrate 111 by thermal oxidation or the like.

Figure 7D:
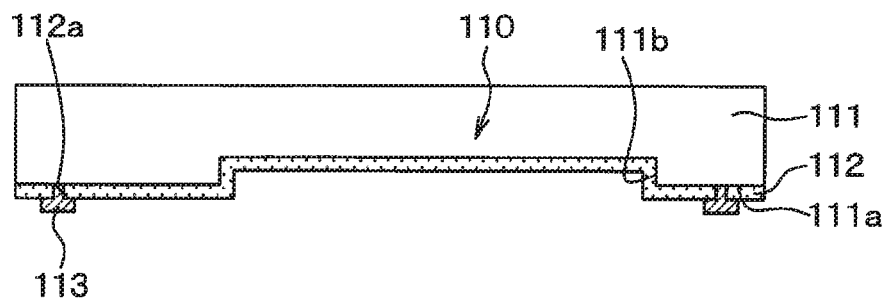

Subsequently, as illustrated in FIG. 7D, after the contact hole 112a is formed in the insulating film 112, the sealing part 113 that is electrically connected to the bonded substrate 111 through the contact hole 112a is formed. Specifically, first, the reactive ion etching or the like is performed on the insulating film 112 with the use of a mask (not illustrated) such as a resistor or an oxide film, and the contact hole 112a is formed in the Insulating film 112. Subsequently, a metal film is formed on the insulating film 112 so that the metal film is buried in the contact hole 112a. Thereafter, the reactive ion etching or the like is performed with the use of a mask (not illustrated) such as a resist or an oxide film, and the metal film is patterned to form the sealing part 113.

Figure 8A:
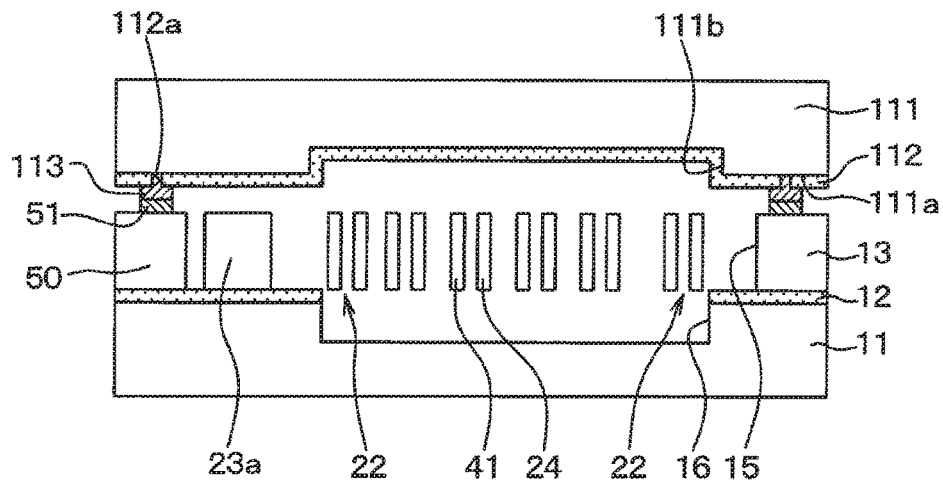
FIGS. 8A to 8C are cross-sectional views illustrating a process of manufacturing the acceleration sensor illustrated in FIG. 1.

Then, as illustrated in FIG. 8A, the semiconductor substrate 10 is joined to the cap 110. Specifically, alignment is performed with an infrared microscope or the like using alignment marks which are suitably formed, and the sealing part 51 of the semiconductor substrate 10 is metal-joined to the sealing part 113 of the cap 110 at 300 to 500° C.

Figure 8B:
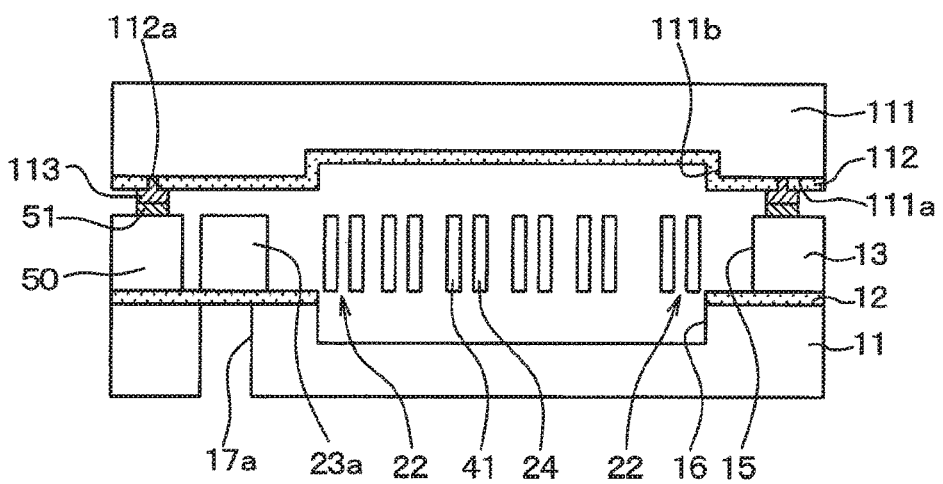

Subsequently, as illustrated in FIG. 8B, four first hole parts 17a that reach the buried insulating film 12 from a side of the support substrate 11 opposite to the buried insulating film 12 are formed. Specifically, the first hole part 17a that reaches the buried insulating film 12 is formed in a portion of the support substrate 11 facing the anchored portion 23a, in the support substrate 11. In another cross-section different from that in FIG. 8B, the two first hole parts 17a that reach the buried insulating film 12 are formed in portions of the support substrate 11 facing the first and second wiring parts 32 and 42, in the support substrate 11. Likewise, the first hole part 17a that reaches the buried insulating film 12 is formed in a portion of the support substrate 11 facing the peripheral part 50, in the support substrate 11.

Figure 8C:
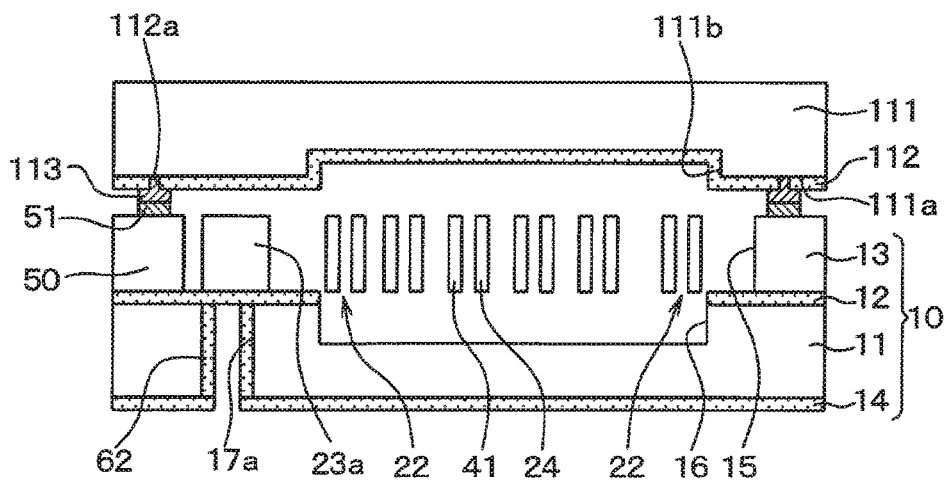

Then, as illustrated in FIG. 8C, the insulating film 62 is formed on the wall surface of the first hole part 17a through a CVD technique or the like. In another cross-section different from that in FIG. 8C, the insulating films 72 to 92 are formed on the wall surfaces of the respective first hole parts 17a. In this situation, the insulating film 14 is configured by an insulating film formed on a side of the support substrate 11 opposite to the buried insulating film 12. In other words, the insulating film 14 and the insulating films 62 to 92 are formed in the same process. In addition, the insulating film 14 is formed in that process, to thereby form the semiconductor substrate 10 in which the insulating film 14, the support substrate 11, the buried insulating film 12, and the semiconductor layer 13 are laminated on each other in the stated order.

Figure 9A:
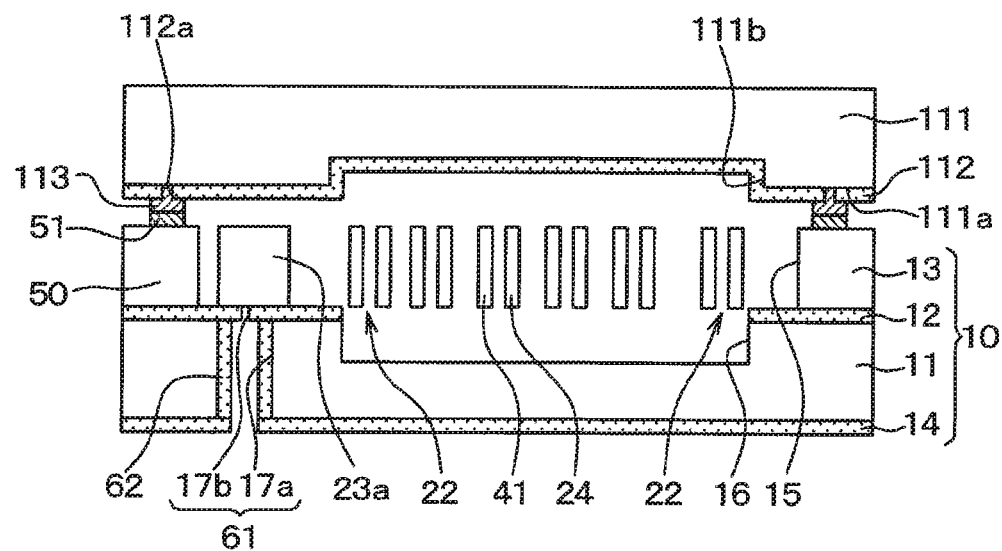
FIGS. 9A and 9B are cross-sectional views illustrating a process of manufacturing the acceleration sensor illustrated in FIG. 1.

Then, as illustrated in FIG. 9A, a second hole part 17b for exposing the anchored portion 23a is formed in the buried insulating film 12 located on a bottom part of each first hole part 17a. With this configuration, the movable electrode hole part 61 is configured by the first and second hole parts 17a and 17b. Further, in another cross-section different from that in FIG. 9A, the second hole part 17b for exposing the first and second wiring parts 32 and 42, or the peripheral part 50 is formed in the buried insulating film 12 located on the bottom part of each first hole part 17a. With the above configuration, the first and second fixed-electrode hole parts 71 and 81, and the peripheral part hole part 91 are formed in the first and second hole parts 17a and 17b. In another cross-section different from that in FIG. 9A, the contact hole 14a is formed in the insulating film 14. The respective second hole parts 17b and the contact hole 14a are formed at the same time.

Figure 9B:
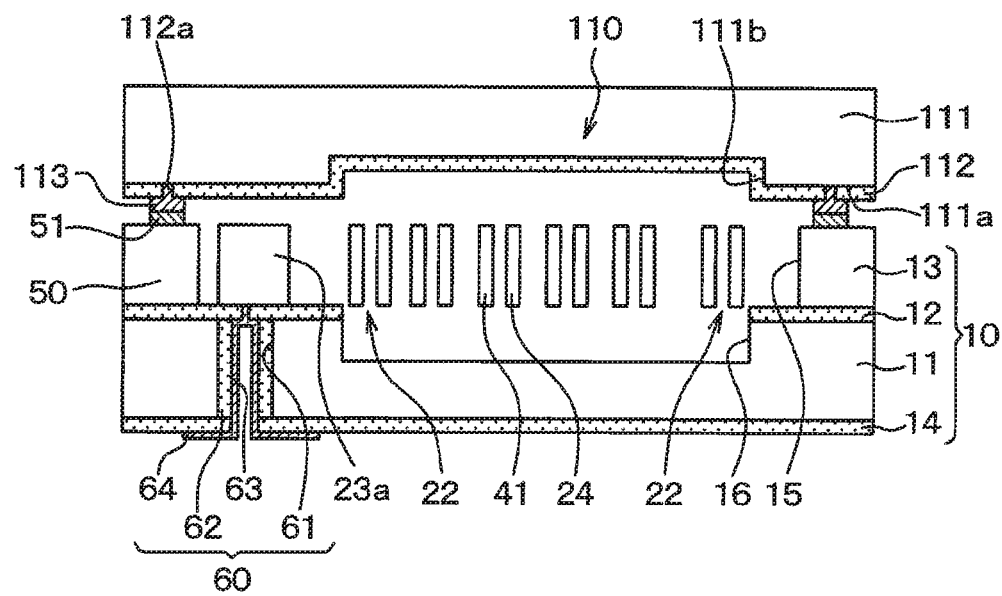

Then, as illustrated in FIG. 9B, a metal film is formed in the movable electrode hole part 61 to form the through-electrode 63 through a sputtering technique or a vapor deposition method or the like. In another cross-section different from that in FIG. 9B, a metal film is formed in the first and second fixed-electrode hole parts 71 and 81, and the peripheral part hole part 91 to form the through-electrodes 73 to 93, and a metal film is formed in the contact hole 14a to form the contact part 100. Thereafter, the metal film on the insulating film 14 is patterned to form the pad part 64. In another cross-section different from that in FIG. 9B, the pad parts 74 to 94 are formed. The acceleration sensor according to the present embodiment is manufactured in the manner described above.

The through-electrodes 63 to 93 and the contact part 100 are formed in the same process for forming the metal film, and the pad parts 64 to 94 are formed in the same process for patterning the metal film. A method for manufacturing one acceleration sensor is described above. Alternatively, after the above processes have been performed in a wafer state, the wafer may be diced into chip units.

As described above, in the present embodiment, the contact part 100 is provided on the support substrate 11, and the support substrate 11 is maintained at a predetermined potential through the contact part 100. In other words, there is no need to form the through-electrode for maintaining the support substrate 11 at the predetermined potential in the interior of the semiconductor layer 13. For that reason, the processing precision can be restrained from being reduced in forming the movable portion 20, and the first and second fixing portions 30 and 40, and hence the detection precision can be restrained from being reduced.

In the present embodiment, the movable-electrode electrode portion 60, the first and second fixed-electrode electrode portions 70, 80, and the peripheral-part electrode portion 90 are formed in the semiconductor substrate 10. The contact part 100 is formed at the same time as forming the movable-electrode electrode portion 60, the first and second fixed-electrode electrode portions 70, 80, and the peripheral-part electrode portion 90. For that reason, there is no need to add the manufacturing process only for forming the contact part 100, and the manufacturing processes are not increased in number.

Further, in the present embodiment, the contact part 100 is integrated with the pad part 94 in the peripheral-part electrode portion 90. For that reason, there is no need to form a new pad part for connecting the contact part 100 and the external circuit.

(Second Embodiment)

A second embodiment of the present disclosure will be described. In the present embodiment, as compared with the first embodiment, the present disclosure is applied to an acceleration sensor for detecting an acceleration in a direction normal to a surface direction of a semiconductor substrate 10, and the other configurations are identical with those in the first embodiment, and therefore will be omitted from description.

Figure 10:
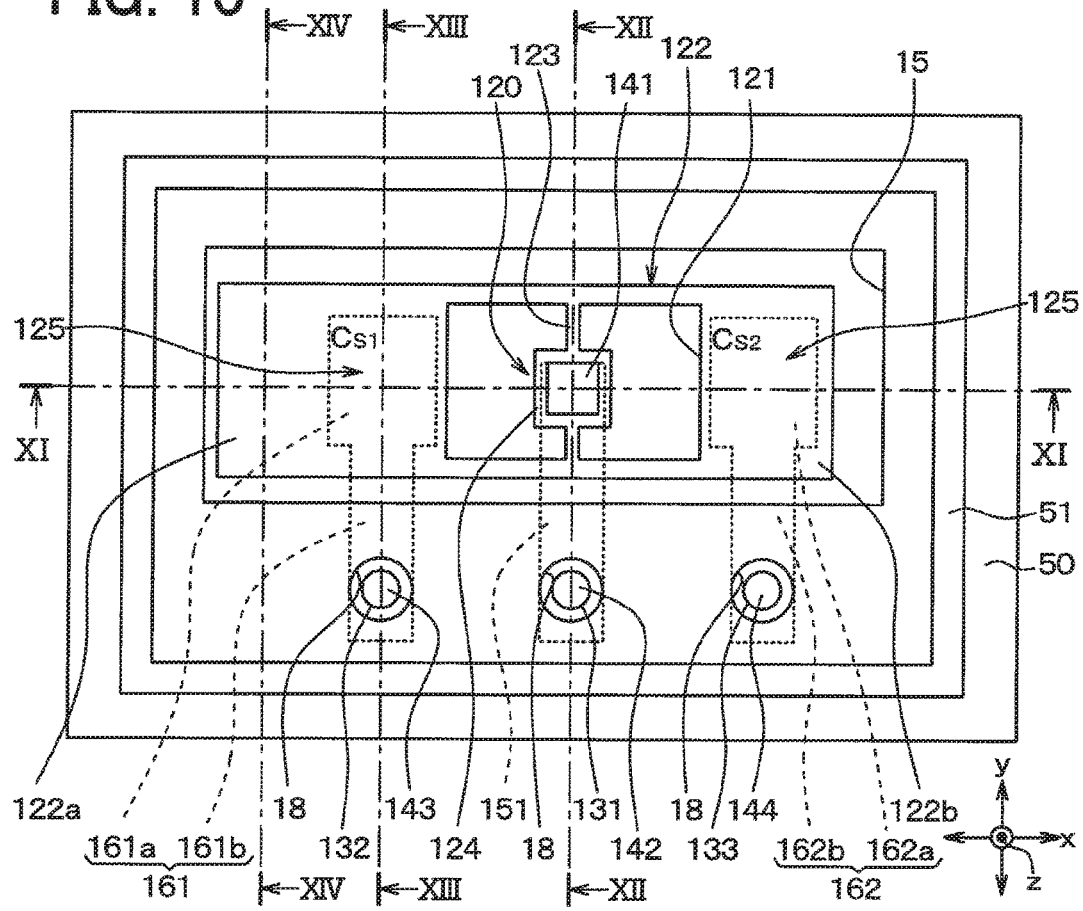
FIG. 10 is a top view of an acceleration sensor according to a second embodiment of the present disclosure.
Figure 11:
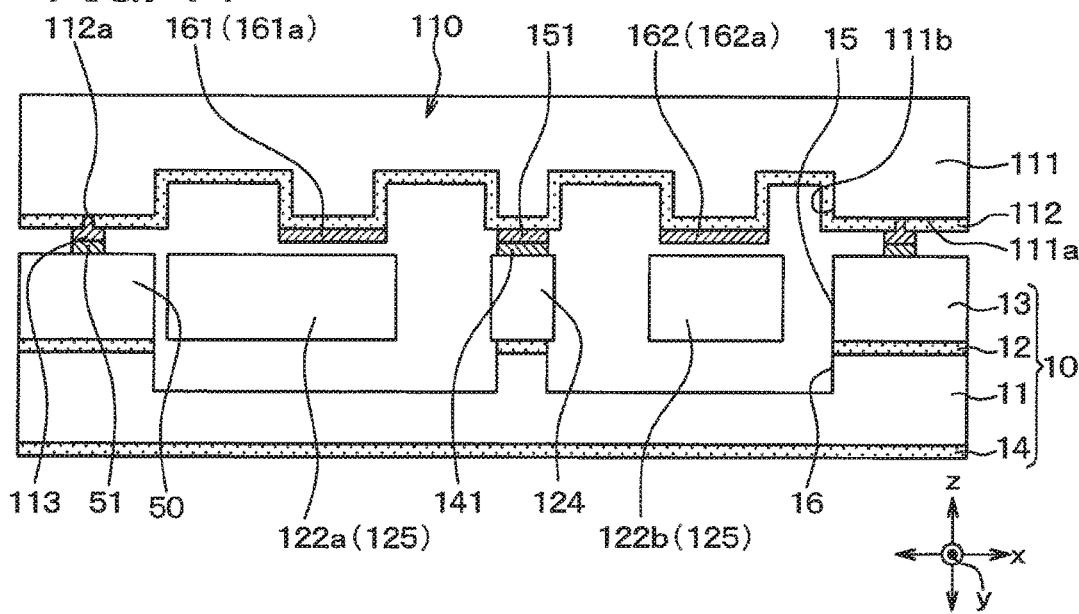
FIG. 11 is a cross-sectional view taken along a line XI-XI in FIG. 10.

As illustrated in FIGS. 10 to 14, in the present embodiment, a movable portion 120 is partitioned by a groove portion 15 in a semiconductor layer 13. FIG. 10 is a top view of the semiconductor substrate 10 in the acceleration sensor, and a movable electrode wiring part 151 and first and second wiring parts 161, 162 to be described later, which are disposed in a cap 110, are indicated by dotted lines.

The movable portion 120 includes a frame portion 122 formed into a rectangular frame shape in which opening portions 121 having a rectangular shape in a top view are defined, and a torsion beam 123 provided to couple opposing sides of the opening portions 121 to each other. The movable portion 120 is supported by a support substrate 11 in such a manner that the torsion beam 123 is coupled to an anchored portion 124 supported to a buried insulating film 12.

Respective directions of an x-axis, a y-axis, and a z-axis in FIGS. 10 to 14 will be described. In FIGS. 10 to 14, a direction along the x-axis represents a horizontal direction on a paper surface of FIG. 10, a direction along the y-axis represents a direction orthogonal to a direction along the x-axis on a plane of the semiconductor substrate 10, and a direction along the z-axis represents a normal direction to a surface direction of the semiconductor substrate 10. Hereinafter, the direction along the x-axis is called "x-axis direction", the direction along the y-axis is called "y-axis direction", and the direction along the z-axis is called "z-axis direction".

The torsion beam 123 is a member defining a rotation axis which is a rotation center of the movable portion 120 when the acceleration in the z-axis direction is applied to the torsion beam 123. In the present embodiment, the torsion beam 123 is provided to divide the opening portion 121 into two pieces.

The frame portion 122 is shaped asymmetrically with respect to the torsion beam 123 so as to be rotatable with the torsion beam 123 as a rotation axis when the acceleration in the z-axis direction is applied to the frame portion 122. In the present embodiment, in the frame portion 122, a length of a first portion 122a in the x-axis direction from the torsion beam 123 to an end of a portion most distant from the torsion beam 123 is set to be longer than a length of a second portion 122b in the x-axis direction from the torsion beam 123 to an end of a portion most distant from the torsion beam 123. In other words, in the frame portion 122 according to the present embodiment, a mass of the first portion 122a is set to be larger than a mass of the second portion 122b.

In the present embodiment, movable electrodes 125 are formed in portions of the frame portion 122 which face first and second fixed electrodes 161a and 162a to be described later. A recessed part 16 is defined in a portion facing the movable portion 120 in the support substrate 11 and the buried insulating film 12.

In a peripheral part 50 of the semiconductor layer 13, a movable electrode connection part 131, and first and second fixed electrode connection parts 132 and 133 are partitioned by groove portions 18. In the present embodiment, the movable electrode connection part 131 corresponds to a portion electrically connected to the movable electrodes 125 in the semiconductor layer 13 of the present disclosure. The first and second fixed electrode connection parts 132 and 133 correspond to portions electrically connected to the first and second fixed electrodes 161a and 162a in the semiconductor layer 13 of the present disclosure.

In the semiconductor layer 13, pad parts 141 to 144 are formed on the anchored portion 124, the movable electrode connection part 131, and the first and second fixed electrode connection parts 132 and 133 together with a sealing part 51 formed on the peripheral part 50. The respective pad parts 141 to 144 are made of aluminum or the like.

Figure 12:
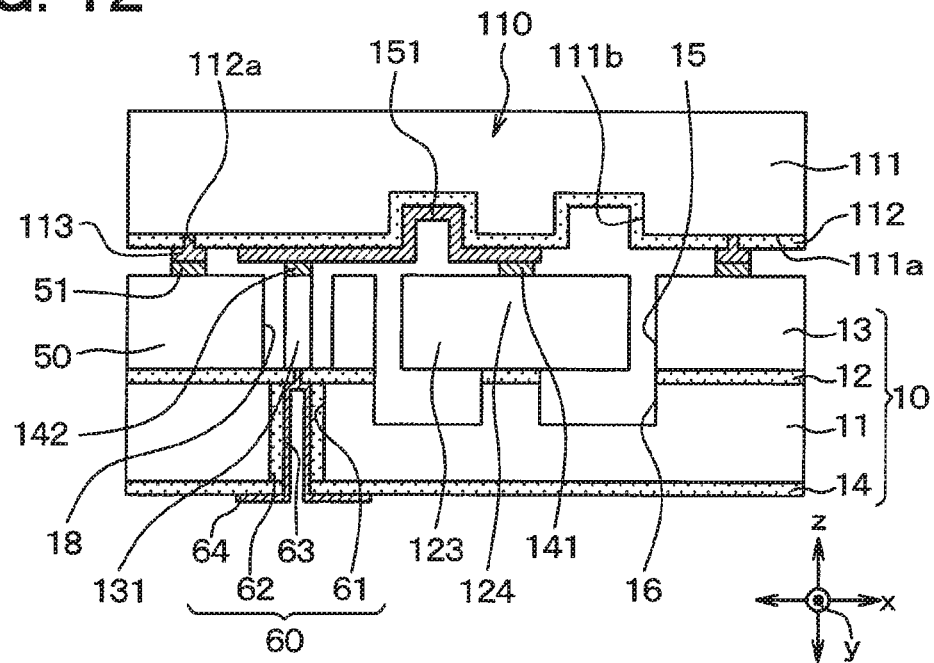
FIG. 12 is a cross-sectional view taken along a line XII-XII in FIG. 10.
Figure 13:
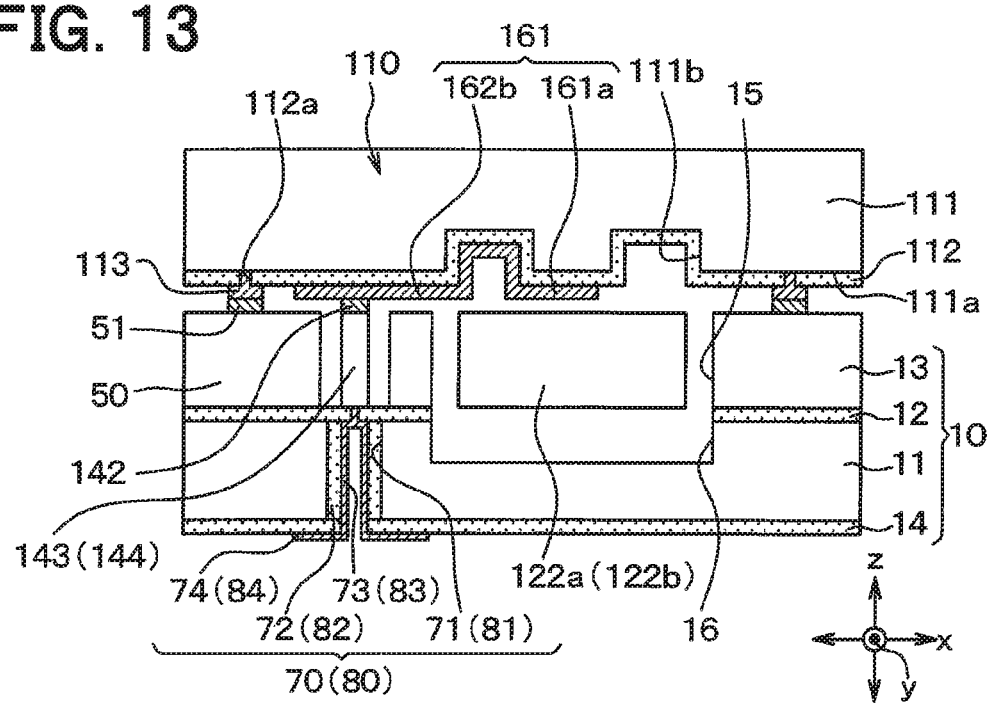
FIG. 13 is a cross-sectional view taken along a line XIII-XIII in FIG. 10.
Figure 14:
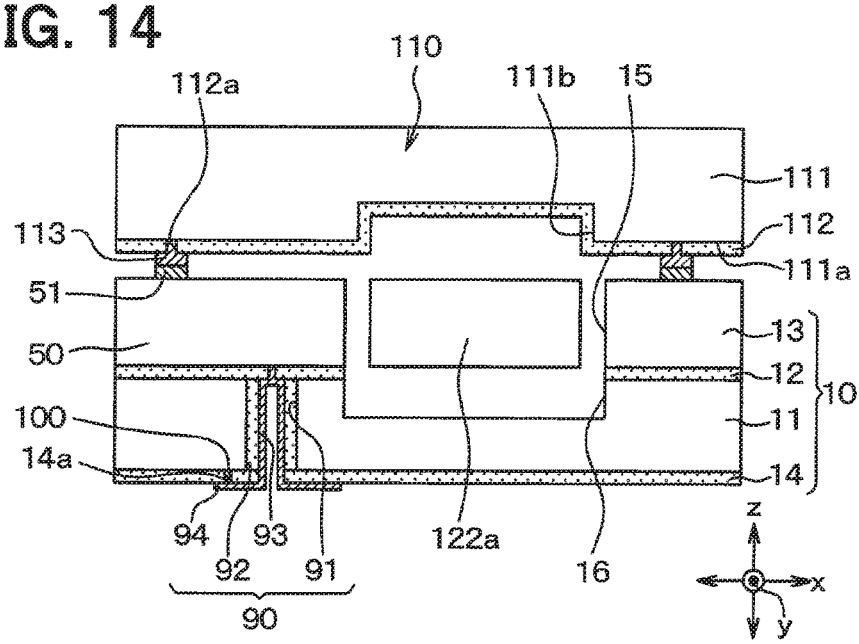
FIG. 14 is a cross-sectional view taken along a line XIV-XIV in FIG. 10.

As illustrated in FIG. 12, a movable-electrode electrode portion 60, which is electrically connected to the movable electrode connection part 131, is formed in the semiconductor substrate 10. Likewise, as illustrated in FIG. 13, first and second fixed-electrode electrode portions 70 and 80, which are electrically connected to the first and second fixed electrode connection parts 132 and 133, respectively, are formed in the semiconductor substrate 10. As illustrated in FIG. 14, a peripheral-part electrode portion 90, which is electrically connected to the peripheral part 50, is formed in the semiconductor substrate 10, and a contact part 100, which is electrically connected to the support substrate 11, is formed in the semiconductor substrate 10.

FIG. 13 illustrates a cross-section taken along the first wiring part 161 to be described later, and a cross-section taken along the second wiring part 162 to be described later is the same as that in FIG. 13. Therefore, in FIG. 13, reference numerals of the first and second fixed electrode connection parts 132 and 133, and the first and second wiring part 161 and 162 are denoted.

As in the first embodiment, the cap 110 includes a bonded substrate 111 and an insulating film 112. As illustrated in FIG. 12, the movable electrode wiring part 151 is formed on the insulating film 112. The movable electrode wiring part 151 extends from a portion of the insulating film 112 facing a pad part 141 formed on the anchored portion 124 to a portion of the Insulating film 112 facing a pad part 142 formed on the movable electrode connection part 131.

As illustrated in FIG. 13, the first and second wiring parts 161 and 162 made of aluminum or the like are formed on the Insulating film 112. Specifically, the first wiring part 161 includes the first fixed electrode 161a formed on a portion facing the first portion 122a, and a first lead line 161b led from the first fixed electrode 161a. The second wiring part 162 includes the second fixed electrode 162a formed on a portion facing the second portion 122b, and a second lead line 162b led from the second fixed electrode 162a.

With the above configuration, in the present embodiment, a capacitance Cs1 is generated between the first portion 122a (movable electrode 125) and the first fixed electrode 161a, and a capacitance Cs2 is generated between the second portion 122b (movable electrode 125) and the second fixed electrode 162a. The acceleration is detected on the basis of a difference between the respective capacitances Cs1 and Cs2.

The first and second fixed electrodes 161a and 162a are formed into the same planar shape, and formed to generate the same capacitance in association with the respective movable electrodes 125 in a state where no acceleration is applied. The first and second lead lines 161b and 162b are extended in portions of the insulating film 112 facing the first and second fixed electrode connection parts 132 and 133, respectively.

A recessed part 111b is appropriately defined in the bonded substrate 111 on a portion of one surface 111a facing the frame portion 122, which is different from the portions on which the first and second fixed electrodes 161a and 162a are formed.

The semiconductor substrate 10 is joined to the cap 110 and Integrated into one piece to configure the acceleration sensor of the present embodiment. Specifically, the semiconductor substrate 10 is integrated with the cap 110 in such a manner that the respective sealing parts 51 and 113 are metal-joined to each other, the pad parts 141 and 142 are metal-joined to the movable electrode wiring part 151, and the pad parts 143 and 144 are metal-joined to the first and second lead lines 161b and 162b.

With the above configuration, when a predetermined potential is applied to the pad part 64 of the movable-electrode electrode portion 60, the predetermined potential is applied to the movable electrodes 125 (anchored portion 124) through the movable electrode connection part 131, the pad part 142, the movable electrode wiring part 151, and the pad part 142. Likewise, when a predetermined potential is applied to the pad parts 74 and 84 of the first and second fixed-electrode electrode portions 70 and 80, the predetermined potential is applied to the first and second fixed electrodes 161a and 162a through the first and second fixed-electrode connection parts 132 and 133, the pad parts 143 and 144, and the first and second lead lines 161b and 162b. When a predetermined potential is applied to the pad part 94 of the peripheral-part electrode portion 90, the predetermined potential is applied to the peripheral part 50 and the support substrate 11, and a potential of the peripheral part 50 is applied to the bonded substrate 111 through the sealing parts 51 and 113.

The configuration of the acceleration sensor of the present embodiment is described above. Next, a method of manufacturing the acceleration sensor of this type will be described in brief.

In the acceleration sensor of this type, the respective pad parts 141 to 144 are formed together with the sealing part 51, in the process of FIG. 6D described above. Further, the groove portion 15 is formed in the semiconductor layer 13 to form the movable portion 120, and groove portions 18 are formed in the semiconductor layer 13 to form the movable electrode connection part 131, and the first and second fixed electrode connection parts 132 and 133, in the process of FIG. 6E.

In the process of FIG. 7D, the sealing part 113 is formed, and the movable electrode wiring part 151 and the first, second wiring parts 161, 162 are formed.

In the process of FIGS. 8 and 9, the movable-electrode electrode portion 60 connected with the movable electrode connection part 131, and the first and second fixed-electrode electrode portions 70 and 80 connected with the first and second fixed electrode connection parts 132 and 133 may be formed.

As described above, the present disclosure can be applied to the acceleration sensor for detecting the acceleration in the normal direction (z-axis direction) to the surface direction of the semiconductor substrate 10.

In the present embodiment, the recessed part 111b is appropriately defined in the bonded substrate 111 on a portion of the one surface 111a facing the frame portion 122, which is different from the portions on which the first and second fixed electrodes 161a and 162a are formed. In other words, an interval between a portion of the frame portion 122 different from a portion of the movable electrodes 125 and the cap 110 is widened. For that reason, a parasitic capacitance generated between the frame portion 122 and the cap 110 can be reduced, and the detection precision can be improved.

(Third Embodiment)

A third embodiment of the present disclosure will be described. In the present embodiment, a recessed part is formed from a side of the support substrate 11 opposite to a buried insulating film 12 as compared with the first embodiment. The other configurations are identical with those in the first embodiment, and therefore their description will be omitted.

Figure 15:
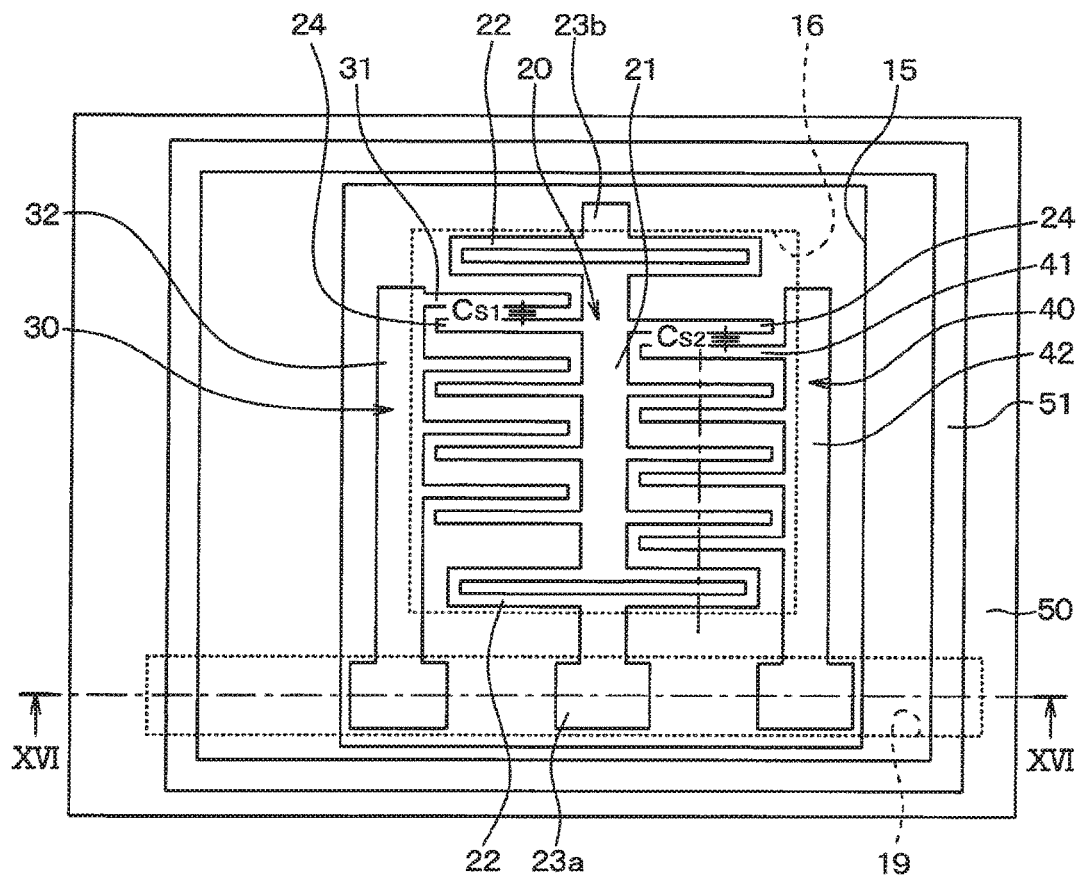
FIG. 15 is a top view of an acceleration sensor according to a third embodiment of the present disclosure.
Figure 16:
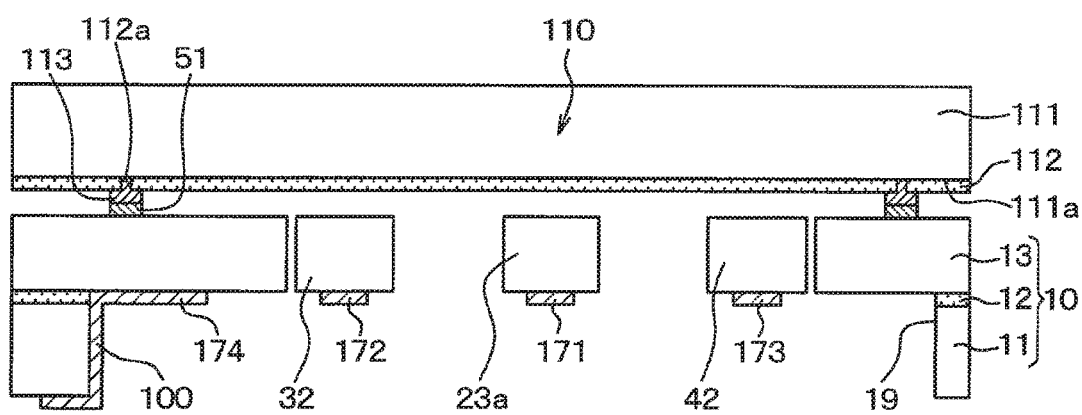
FIG. 16 is a cross-sectional view taken along a line XVI-XVI in FIG. 15.

As illustrated in FIGS. 15 and 16, in the present embodiment, the support substrate 11, the buried insulating film 12, and a semiconductor layer 13 are laminated on each other in the stated order to configure a semiconductor substrate 10. A recessed part 19 for exposing the semiconductor layer 13 from a side of the support substrate 11 opposite to the buried insulating film 12 is formed in the semiconductor substrate 10. Specifically, the recessed part 19 is formed to expose an anchored portion 23a, parts of first and second wiring parts 32 and 42, and a part of a peripheral part 50, collectively. The recessed part 19 is provided separately from a recessed part 16.

Portions of the anchored portion 23a, the first and second wiring parts 32 and 42, and the peripheral part 50, which are exposed from the recessed part 19, are formed with pad parts 171 to 174. The pad part 174 formed on the peripheral part 50 is extended to the support substrate 11 exposed from the recessed part 19 and a side of the support substrate 11 opposite to the buried insulating film 12. The pad part 174 forms a contact part 100 at a portion that comes in contact with the support substrate 11. In other words, the same potential as that of the peripheral part 50 is applied to the support substrate 11.

The configuration of the acceleration sensor of the present embodiment is described above. Subsequently, a method for manufacturing the acceleration sensor of this type will be described with reference to FIGS. 17A to 17F and 18A to 18C. FIGS. 17A to 17F and 18A to 18C are cross-sectional views taken along a line XVI-XVI in FIG. 15.

Figure 17A:
FIGS. 17A to 17F are cross-sectional views illustrating a process of manufacturing the acceleration sensor illustrated in FIG. 15.
Figure 17B:

First, as illustrated in FIG. 17A, the buried insulating film 12 is formed on the support substrate 11, and as illustrated in FIG. 17B, a first recessed portion 19a is formed in the support substrate 11 and the buried insulating film 12. The first recessed portion 19a is formed in the same process as that of the recessed part 16.

Figure 17C:
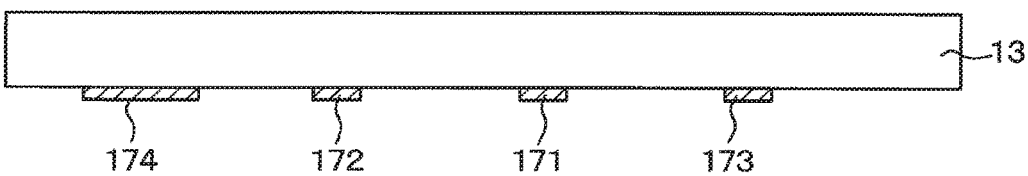

Subsequently, as illustrated in FIG. 17C, the semiconductor layer 13 is prepared, and a metal film is formed on a side of the semiconductor layer 13 which is joined to the buried insulating film 12. A reactive ion etching or the like is performed with the use of a mask (not illustrated) such as a resist or an oxide film, and the metal film is patterned to form the pad parts 171 to 174 in formations areas where the anchored portion 23a, the first and second wiring parts 32 and 42, and the peripheral part 50 are to be formed.

Figure 17D:
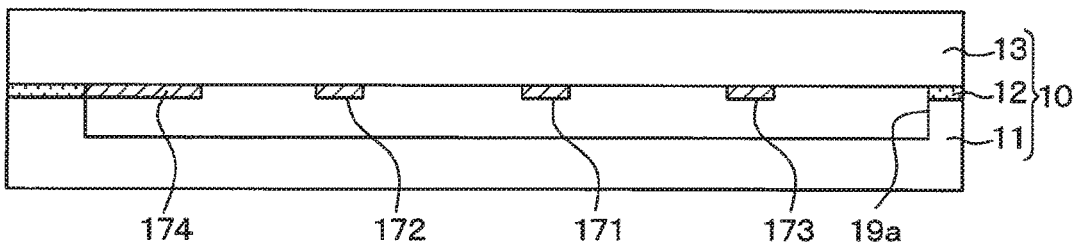

Subsequently, as illustrated in FIG. 17D, the buried insulating film 12 is joined to the semiconductor layer 13 in the same process as that in FIG. 6C described above. In this situation, the buried insulating film 12 is joined to the semiconductor layer 13 so that the pad parts 171 to 174 are housed in the first recessed portion 19a.

Figure 17E:
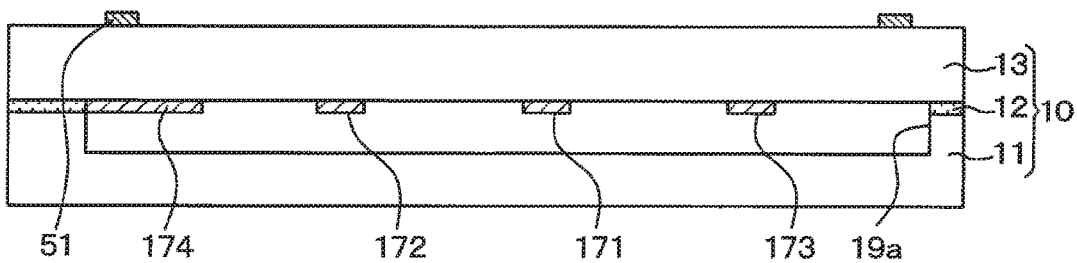
Figure 17F:
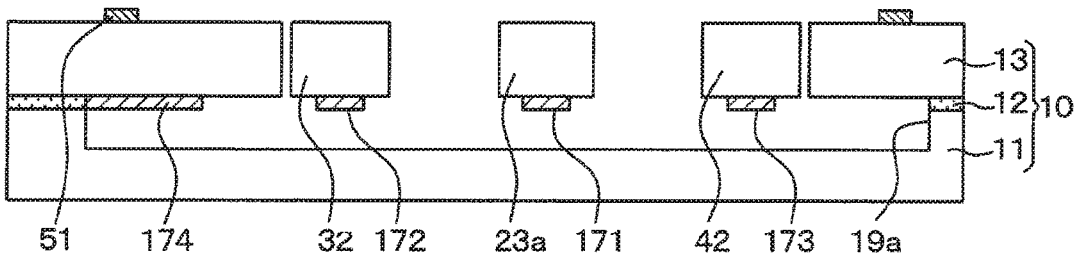

Thereafter, as illustrated in FIGS. 17E and 17F, the same processes as those in FIGS. 6D and 6E are performed, and a sealing part 51 is formed while a movable portion 20 and first, second fixing portions 30, 40 are formed.

Figure 18A:
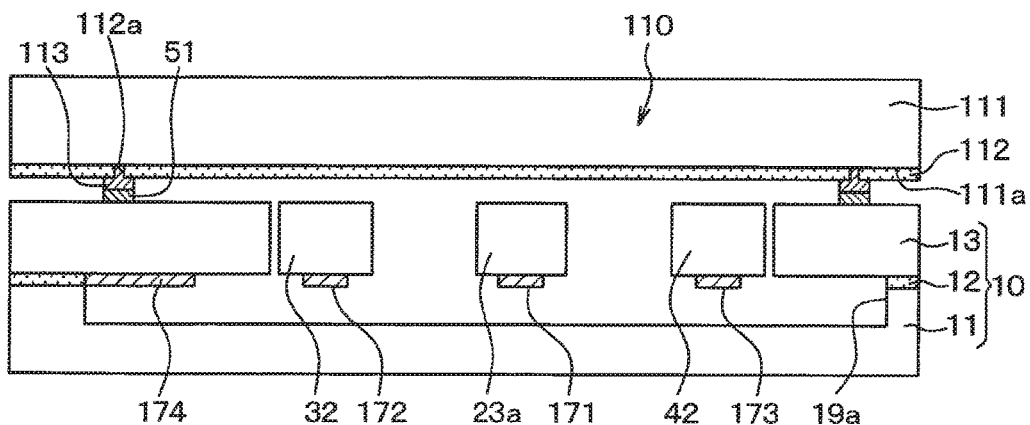
FIGS. 18A to 18C are cross-sectional views illustrating a process of manufacturing the acceleration sensor illustrated in FIG. 15.

After the processes in FIGS. 7A to 7D described above are performed to prepare a cap 110, the same process as that in FIG. 8A described above is performed, and the semiconductor layer 13 is joined to the cap 110 as illustrated in FIG. 18A.

Figure 18B:
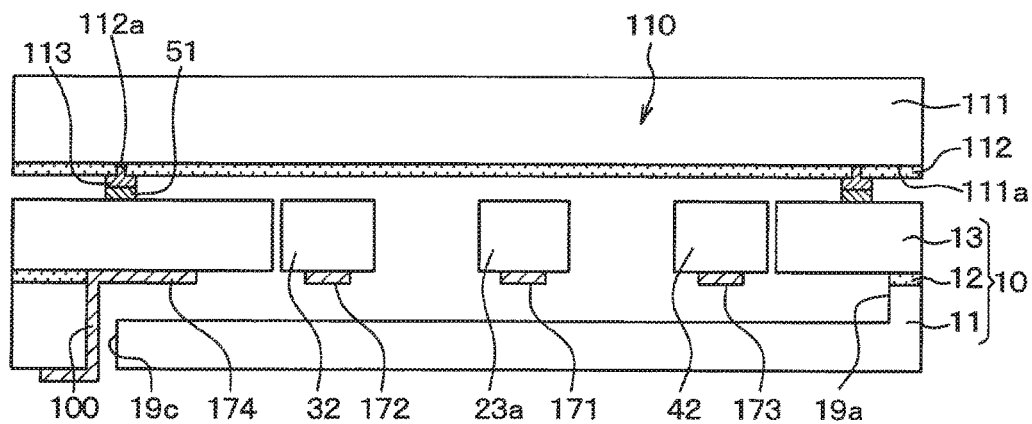

Subsequently, as illustrated in FIG. 18B, a through-hole 19c that reaches the pad part 174 from a side of the support substrate 11 opposite to the buried insulating film 12 is formed. Then, a metal film is formed in the through-hole 19c by a mask vapor deposition technique or the like. Specifically, the metal film is formed on a portion of the through-hole 19c so as to be integrated with the pad part 174 to form the contact part 100. The portion of the through-hole 19c configures a wall surface of the support substrate 11 exposed from the recessed part 19 in performing a process of FIG. 18C to be described later. Then, the metal film formed on a side of the support substrate 11 opposite to the buried insulating film 12 is patterned.

Figure 18C:
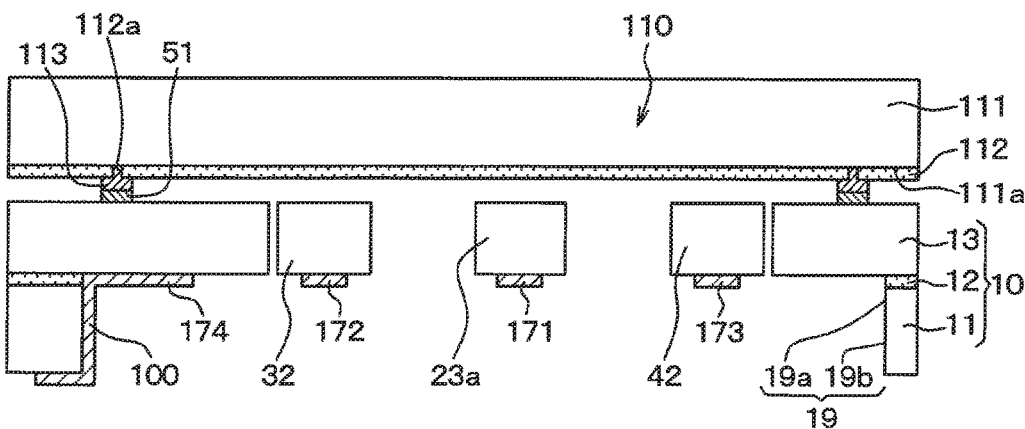

Thereafter, as illustrated in FIG. 18C, a second recessed portion 19b that communicates with the first recessed portion 19a from a side of the support substrate 11 opposite to the buried insulating film 12 is formed, to thereby form the recessed part 19. In this way, the acceleration sensor of the present embodiment is manufactured.

As described above, in place of the movable-electrode electrode portion 60, the first and second fixed-electrode electrode portions 70, 80, and the peripheral-part electrode portion 90, the recessed part 19 for exposing the anchored portion 23a, the first and second wiring parts 32 and 42, and the peripheral part 50, collectively, may be formed, and the pad parts 171 to 174 and the contact part 100 may be formed in portions exposed from the recessed part 19. Similarly, the same advantages as those in the first embodiment can be obtained by the acceleration sensor described above.

(Other Embodiments)

The present disclosure has been described based on the embodiments, and it is understood that this disclosure is not limited to the embodiments or the structures. The present disclosure may include various modification examples, or equivalent modifications. In addition, various combinations or forms, or other combinations or forms containing only one element, more elements or less elements are included in the category or conceptual range of the present disclosure.

For example, in the above respective embodiments, the acceleration sensor as the physical quantity sensor has been described. Alternatively, the present disclosure can be applied to an angular velocity sensor as the physical quantity sensor.

In the first and third embodiments, the cap 110 may not have the insulating film 112. In other words, the sealing part 113 may be formed on one surface 111a of the bonded substrate 111.

In addition, in the above first and third embodiments, the insulating film 112 may not be formed on the bonded substrate 111, but the peripheral part 50 of the semiconductor layer 13 may be joined, for example, directly to the bonded substrate 111 to electrically connect the semiconductor layer 13 to the bonded substrate 111.

In the first to third embodiments, the contact part 100 may not be integrated with the pad part 94 in the peripheral-part electrode portion 90.

In the above third embodiment, the example in which the contact part 100 is extended to a side of the support substrate 11 opposite to the buried insulating film 12 has been described. Alternatively, the contact part 100 may be formed on only the support substrate 11 exposed from the recessed part 19. The contact part 100 may be formed on only a portion of the support substrate 11 opposite to the buried insulating film 12.

Further, in the above respective embodiments, the peripheral part 50 may not be electrically connected to the cap 110 (bonded substrate 111). In that case, the contact part electrically connected to the external circuit may be formed on the bonded substrate 111 to maintain the bonded substrate 111 at a predetermined potential. In addition, in the above respective embodiments, multiple through-electrodes may be formed in the cap 110, and a predetermined potential may be applied to the movable electrodes 24, 125, the fixed electrodes 31, 41, 161a, 162a, and the peripheral part 50 through through-electrodes formed in the cap 110.

Moreover, the above respective embodiments may be appropriately combined with each other. In other words, the third embodiment may be combined with the second embodiment, and the formation of the movable-electrode electrode portion 60, the first and second fixed-electrode electrode portions 70, 80, and the peripheral-part electrode portion 90 may be replaced with the provision of the recessed part 19.

The invention claimed is:

1. A physical quantity sensor comprising:
    a semiconductor substrate that includes a support substrate, a buried insulating film disposed on the support substrate, and a semiconductor layer disposed on an opposite side to the support substrate across the buried insulating film;
    a movable electrode that is disposed in the semiconductor layer, and displaced according to a physical quantity;
    a peripheral part that surrounds the movable electrode and is partitioned from the movable electrode in the semiconductor layer;
    a fixed electrode that is disposed to oppose the movable electrode; and
    a cap that is joined to the semiconductor layer, and seals the movable electrode, wherein
    the support substrate and the cap are maintained at a predetermined potential,
    the support substrate includes a contact part that is to be directly and electrically connected to an external circuit, and is maintained at the predetermined potential through the contact part,
    the support substrate and the buried insulating film are formed with a movable electrode hole part that reaches a portion of the semiconductor layer electrically connected to the movable electrode, a fixed electrode hole part that reaches a portion of the semiconductor layer electrically connected to the fixed electrode, and a peripheral part hole part that reaches the peripheral part, from a side of the semiconductor substrate opposite to the buried insulating film,
    through-electrodes that are to be electrically connected to the external circuit through insulating films are disposed in the movable electrode hole part, the fixed electrode hole part, and the peripheral part hole part,
    the cap is electrically connected to the peripheral part to be maintained at the predetermined potential,
    the semiconductor substrate has an insulating film on an opposite side to the buried insulating film across the support substrate,
    the through-electrode disposed in the peripheral part hole part is connected to a pad part that is disposed on the insulating film to be electrically connected to the external circuit,
    the contact part is disposed in the insulating film and electrically connected to the support substrate, and
    the contact part is integrated with the pad part.

2. A physical quantity sensor comprising:
    a semiconductor substrate that includes a support substrate, a buried insulating film disposed on the support substrate, and a semiconductor layer disposed on an opposite side to the support substrate across the buried insulating film;
    a movable electrode that is disposed in the semiconductor layer, and displaced according to a physical quantity;
    a peripheral part that surrounds the movable electrode and is partitioned from the movable electrode in the semiconductor layer;
    a fixed electrode that is disposed to oppose the movable electrode; and
    a cap that is joined to the semiconductor layer, and seals the movable electrode, wherein
    the support substrate and the cap are maintained at a predetermined potential, the support substrate includes a contact part that is to be directly and electrically connected to an external circuit, and is maintained at the predetermined potential through the contact part, the support substrate and the buried insulating film are formed with a recessed part that collectively expose a portion of the semiconductor layer electrically connected to the movable electrode, a portion of the semiconductor layer electrically connected to the fixed electrode, and the peripheral part of the semiconductor layer from a side of the support substrate opposite to the buried insulating film, the portion of the semiconductor layer electrically connected to the movable electrode, the portion of the semiconductor layer electrically connected to the fixed electrode, and the peripheral part, which are exposed from the recessed part, are provided with pad parts to be electrically connected to external circuits, and the cap is electrically connected to the peripheral part to be maintained at the predetermined potential.

3. The physical quantity sensor according to claim 2, wherein
the pad part disposed on the peripheral part exposed from the recessed part is extended to the support substrate exposed from the recessed part to provide the contact part.

4. The physical quantity sensor according to claim 1, wherein
the peripheral part is provided with a seal part that is formed of a conductive member and surrounds the movable electrode, and the cap is provided with a seal part that has a shape corresponding to the seal part of the peripheral part and formed of a conductive member, and
the seal part of the peripheral part and the seal part of the cap are joined to each other to electrically connect the peripheral part and the cap to each other.

5. The physical quantity sensor according to claim 1, wherein
the movable electrode is displaced according to the physical quantity in a direction parallel to a planar direction of the semiconductor substrate, and
the fixed electrode is disposed in the semiconductor layer, and partitioned from the peripheral part.

6. The physical quantity sensor according to claim 1, wherein
the movable electrode is displaced according to the physical quantity in a direction normal to a planar direction of the semiconductor substrate, and
the fixed electrode is disposed in a portion of the cap facing the movable electrode.

7. The physical quantity sensor according to claim 6, wherein
the movable electrode is provided by a part of a frame portion disposed in the semiconductor layer, and
the cap is formed with a recessed part at a portion that is opposed to the frame portion and different from a portion where the fixed electrode is disposed.

8. A method for manufacturing a physical quantity sensor, the physical quantity sensor including:
a semiconductor substrate that includes a support substrate, a buried insulating film disposed on the support substrate, and a semiconductor layer disposed on an opposite side to the support substrate across the buried insulating film;
a movable electrode that is disposed in the semiconductor layer, and displaced according to a physical quantity;
a peripheral part that surrounds the movable electrode and is partitioned from the movable electrode in the semiconductor layer;
a fixed electrode that is disposed to oppose the movable electrode; and
a cap that is joined to the semiconductor layer, and seals the movable electrode, wherein
the support substrate and the cap are maintained at a predetermined potential,
the support substrate includes a contact part that is to be directly and electrically connected to an external circuit,
the support substrate and the buried insulating film are formed with a movable electrode hole part that reaches a portion of the semiconductor layer electrically connected to the movable electrode, a fixed electrode hole part that reaches a portion of the semiconductor layer electrically connected to the fixed electrode, and a peripheral part hole part that reaches the peripheral part, from a side of the semiconductor substrate opposite to the buried insulating film, and
through-electrodes that are to be electrically connected to external circuits through insulating films are disposed in the movable electrode hole part, the fixed electrode hole part, and the peripheral part hole part,
the cap is electrically connected to the peripheral part to be maintained at the predetermined potential,
the semiconductor substrate has an insulating film on an opposite side to the buried insulating film across the support substrate,
the through-electrode disposed in the peripheral part hole part is connected to a pad part that is disposed on the insulating film to be electrically connected to the external circuit,
the contact part is disposed in the insulating film and electrically connected to the support substrate, and
the contact part is integrated with the pad part;
the manufacturing method comprising:
preparing the semiconductor substrate;
partitioning the movable electrode and the peripheral part in the semiconductor layer;
joining the semiconductor layer and the cap so that the peripheral part of the semiconductor layer is electrically connected to the cap;
forming first hole parts in the support substrate to reach the buried insulating film at a portion opposing to a portion electrically connected to the movable electrode, a portion opposing to a portion electrically connected with the fixed electrode, and a portion opposing to the peripheral part, from a side opposite to the buried insulating film side;
forming the insulating films in the first hole parts and an insulating film on a portion of the support substrate on a side opposite to the buried insulating film;
forming a contact hole for exposing the support substrate in the insulating film formed on the portion of the support substrate opposite to the buried insulating film while forming second hole parts in the buried insulating film located at the bottom of the first hole parts to thereby form the movable electrode hole part, the fixed electrode hole part, and the peripheral part hole part by the first and second hole parts; and
forming the contact part in the contact hole while forming the through-electrodes in the movable electrode hole part, the fixed electrode hole part, and the peripheral part hole part through the insulating films.

9. The physical quantity sensor according to claim 2, wherein the peripheral part is provided with a seal part that is formed of a conductive member and surrounds the movable electrode, and the cap is provided with a seal part that has a shape corresponding to the seal part of the peripheral part and formed of a conductive member, and the seal part of the peripheral part and the seal part of the cap are joined to each other to electrically connect the peripheral part and the cap to each other.

10. The physical quantity sensor according to claim 2, wherein the movable electrode is displaced according to the physical quantity in a direction parallel to a planar direction of the semiconductor substrate, and the fixed electrode is disposed in the semiconductor layer, and partitioned from the peripheral part.

11. The physical quantity sensor according to claim 2, wherein the movable electrode is displaced according to the physical quantity in a direction normal to a planar direction of the semiconductor substrate, and the fixed electrode is disposed in a portion of the cap facing the movable electrode.

12. The physical quantity sensor according to claim 11, wherein the movable electrode is provided by a part of a frame portion disposed in the semiconductor layer, and the cap is formed with a recessed part at a portion that is opposed to the frame portion and different from a portion where the fixed electrode is disposed.

* * * * *